(12) United States Patent
Nagai

(10) Patent No.: US 7,365,404 B2
(45) Date of Patent: Apr. 29, 2008

(54) SEMICONDUCTOR DEVICE HAVING SILICIDE REACTION BLOCKING REGION

(75) Inventor: Kenichi Nagai, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 316 days.

(21) Appl. No.: 10/938,516

(22) Filed: Sep. 13, 2004

(65) Prior Publication Data
US 2005/0062108 A1 Mar. 24, 2005

(30) Foreign Application Priority Data
Sep. 19, 2003 (JP) .......................... P2003-328207

(51) Int. Cl.
*H01L 29/76* (2006.01)
*H01L 29/94* (2006.01)
(52) U.S. Cl. .................. 257/413; 257/384; 257/408
(58) Field of Classification Search ................ 257/344, 257/382–384, 388, 408, 412, 413
See application file for complete search history.

(56) References Cited

U.S. PATENT DOCUMENTS 5,923,070 A 7/1999 Yamada 7,112,856 B2 * 9/2006 Cho et al. ................. 257/384

FOREIGN PATENT DOCUMENTS

| JP | 5-326552 | 12/1993 |
|----|----------|---------|
| JP | 9-64349 | 3/1997 |
| JP | 10-178171 | 6/1998 |
| JP | 10-261588 | 9/1998 |
| JP | 2001-203346 | 7/2001 |
| JP | 2002-190590 | 7/2002 |

* cited by examiner

*Primary Examiner*—Hung Vu
(74) *Attorney, Agent, or Firm*—Nixon & Vanderhye P.C.

(57) ABSTRACT

A semiconductor device has a silicon substrate, an n-type well region formed in the silicon substrate, first and second source/drain regions constructed of a p-type diffusion layer formed on the n-type well region, a gate insulator formed in a region located between the first source/drain region and the second source/drain region and a polysilicon formed on the gate insulator. The semiconductor device has oxygen-rich layers for blocking a silicide reaction, which layers are formed in an uppermost portion of the silicon substrate on the side of the polysilicon, and has an oxygen-rich layer for blocking the silicide reaction, which layer is formed in an upper portion of the polysilicon.

4 Claims, 3 Drawing Sheets

SEMICONDUCTOR DEVICE HAVING SILICIDE REACTION BLOCKING REGION

CROSS-REFERENCE TO RELATED APPLICATIONS

This nonprovisional application claims priority under 35 U.S.C. §119(a) on Patent Application No. 2003-328207 filed in Japan on 19 Sep. 2003, the entire contents of which are incorporated herein by reference.

BACKGROUND OF THE INVENTION

The present invention relates to a semiconductor device and a manufacturing method therefor.

In the method for manufacturing a semiconductor device that has an MOSFET (Metal Oxide Semiconductor Field-Effect Transistor) structure, it is one of the important elemental technologies to reduce the resistances of the diffusion layer and the gate electrode in order to cope with miniaturization and speeding-up of the semiconductor device. For the purpose of reduction in resistance, a so-called silicide technology is adopted for the semiconductor device manufacturing method, with which a low-resistance high-melting-point metal silicide is normally formed in a self-alignment manner on the surfaces of the source/drain electrodes and the gate electrode of a transistor.

The silicide technology will be specifically described below with reference to FIG. 3.

Firstly, a silicon substrate 301 including an element isolation oxide 303 and a well region 302 is prepared. Then, a gate insulator 304 is formed on the silicon substrate 301, and thereafter, a polysilicon for forming a gate electrode 305 is formed on the gate insulator 304. Then, sidewall spacers 307 are formed on both sides of the polysilicon. Subsequently, LDD (Lightly Doped Drain) regions 306 and source/drain regions 308 are formed in the well 302 by using the sidewall spacers 307 to obtain a MOSFET. Next, a high-melting-point metal (e.g., cobalt) is deposited as a film on the entire surface of the silicon substrate 301 by the sputtering method. Subsequently, heat treatment is carried out to react the high-melting-point metal with the silicon, so that silicide layers 310 are formed in a self-alignment manner on the gate electrode 305 and the source/drain regions 308. Then, unreacted high-melting-point metal is removed by chemical processing. Finally, heat treatment is carried out to make the silicide layers 310 have a low resistance.

However, during the silicidation process as described above, the silicide reaction nonuniformly progresses due to a crystal defect and so on existing in the silicon, and thereby unevenness generates at the interface between the silicide layers 310 and the silicon layer as shown in FIG. 3. As a result, the silicide layers 310 are formed partially reaching deep into the gate electrode 305 and the silicon substrate 301, disadvantageously causing obstacles in the electrical characteristics.

That is, if the silicide layer 310 reaches the neighborhood of the gate insulator 304 next to the gate electrode 305, then there are caused a change in the transistor characteristics and deterioration in the gate insulator reliability. Moreover, if the silicide layers 310 reach the neighborhood of the junction plane of the well region 302 and the source/drain region 308, then an increase in the junction leakage current is caused.

The short-channel effect of the transistor becomes significant as the semiconductor device is miniaturized and integrated in a large scale. Accordingly, there is generally adopted a method for shallowing the pn junction depth of the source/drain regions as a measure for avoiding the short-channel effect. However, there is a significant problem that the junction leakage current increases due to the nonuniformity of the silicide reaction as the pn junction depth of the source/drain regions is shallowed.

For example, JP 05-326552A discloses a method for solving the increase in the junction leakage current caused by the nonuniformity of the silicide reaction. This document proposes a method for making the source/drain regions have a two-step structure. This method extends a distance from the silicide reaction plane to the pn junction plane, and therefore, the junction leakage current is reduced. However, there is a problem that the junction leakage current cannot completely be restrained because of not eliminating the root cause of the nonuniformity of the silicide reaction. Moreover, the influence of the silicide reaction on the gate insulator is not solved yet. In other words, there is a problem that the silicide reaction cannot be blocked from reaching the gate insulator.

Moreover, JP 2002-190590A proposes a method for separating the silicide reaction plane from the source/drain region by using a selective silicon growth technique. That is, the distance between the silicide layer and the source/drain region is increased. However, there is a problem that the short-channel characteristic is deteriorated under the influence on the impurity profile of the substrate due to high-temperature heat treatment required by the selective silicon growth technique. There is a further problem that a significant increase in the number of process stages cannot be avoided.

Furthermore, JP 2001-203346A proposes a method for blocking the silicide layer from intruding into an LDD region by forming a silicide reaction blocking layer under sidewall spacers. However, an increase in the junction leakage current emerges as a problem when the pn junction depth of the source/drain region is shallowed because the silicide reaction unevenly occurs in the thickness direction of the substrate.

As described above, it is required to shallow the pn junction depth of the source/drain regions in order to block the short-channel effect in accordance with the miniaturization of the MOSFET, and it is required to form a silicide layer in order to restrain the increase in the electrical resistance of the source/drain. However, it is difficult to completely solve the problems of the junction leakage increase and the deterioration of the gate insulator reliability attributed to the nonuniform reaction of the silicide by the methods of the above-stated first through third patent documents.

SUMMARY OF THE INVENTION

An object of the present invention is therefore to provide a semiconductor device capable of restraining the junction leakage increase and the deterioration of the gate insulator reliability and a manufacturing method therefor.

In order to solve the above-stated problems, a first aspect of the present invention provides a semiconductor device comprising:

a substrate;

a first conductive type well region formed in the substrate;

first and second source/drain regions constructed of a second conductive type diffusion layer formed on the well region;

a gate insulator formed in a region located between the first source/drain region and the second source/drain region;

a gate electrode formed on the gate insulator; and first silicide reaction blocking regions formed in upper portions of the gate electrode and the first and second source/drain regions to block a silicide reaction in a thickness direction of the substrate.

In this specification, the first conductive type means the p-type or the n-type. Moreover, the second conductive type means the n-type when the first conductive type is the p-type or means the p-type when the first conductive type is the n-type.

According to the semiconductor device of the above-stated construction, the first silicide reaction blocking regions block the silicide reaction for forming silicide layers in the thickness direction of the substrate when the silicide layers are formed on the first silicide reaction blocking regions. With this arrangement, the silicide reaction does not progress into the deep regions of the gate electrode and the first and second source/drain regions. Therefore, the silicide layer surfaces located on the side of the substrate do not become uneven because the nonuniform reaction of silicide does not occur. That is, the silicide layers neither penetrate the first silicide reaction blocking regions nor come in contact with the gate insulator and the well region. Therefore, the gate electrode and the first and second source/drain regions are allowed to have a low resistance by virtue of the silicide layers, and the junction leakage current can be restrained.

Moreover, the silicide does not diffuse to the gate insulator in the gate electrode, and therefore, the reliability of the gate insulator is not impaired.

In one embodiment of the present invention, the semiconductor device further comprises:

lightly doped drain regions formed on sides of the first and second source/drain regions in vicinity to the gate electrode, the lightly doped drain regions having an impurity concentration lower than those in the first and second source/drain regions; and second silicide reaction blocking regions formed in the lightly doped drain regions at end portions opposite from the gate electrode to block the silicide reaction in a direction parallel to a surface of the substrate.

According to the semiconductor device of the above-stated embodiment, the second silicide reaction blocking regions are formed at the end portions of the lightly doped drain regions located on the side opposite to the gate electrode. Therefore, even if the silicide layers are formed on the first silicide reaction blocking regions, the silicide layers do not extend to the inside of the lightly doped drain regions owing to the second silicide reaction blocking regions. That is, the silicide layers can be prevented from intruding into the lightly doped drains. Therefore, the deterioration of the leakage characteristic between the gate and the source/drain can be prevented.

In one embodiment of the present invention, at least one of the first and second silicide reaction blocking regions is constructed of a highly doped layer in which a concentration of oxygen or nitrogen or carbon is not lower than $1 \times 10^{18}$ cm$^{-3}$.

According to the semiconductor device of the above-stated embodiment, the silicide reaction can be surely prevented from progressing.

If the concentration of oxygen or nitrogen or carbon in the highly doped layer is lower than $1 \times 10^{18}$ cm$^{-3}$, the junction leakage current of the source/drain regions is disadvantageously increased.

In one embodiment of the present invention, a concentration of silicide reaction high-melting-point metal atoms at an interface between the gate insulator and the gate electrode and at interfaces between the well region and the first and second source/drain regions is not higher than $1 \times 10^{16}$ cm$^{-3}$.

According to the semiconductor device of the above-stated embodiment, the junction leakage current can reliably be restrained, and the deterioration of the leakage characteristic between the gate and the source/drain can reliably be prevented.

A second aspect of the present invention provides a method for manufacturing the above semiconductor device, comprising the step of forming the first silicide reaction blocking regions by implanting ions of oxygen or nitrogen or carbon.

According to the semiconductor device manufacturing method, nonuniform silicide reaction can be restrained by effectively forming the silicide reaction blocking layers with minimum increase in number of process stages.

Also, there is no change in the thermal history through the formation of the first silicide reaction blocking regions by the above-stated ion implantation. Moreover, oxygen, nitrogen and carbon, are impurities which do not determine the conductive type even when existing in silicon, and therefore exert no influence on the original transistor characteristics.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

The semiconductor device and the manufacturing method according to the present invention will be described in detail below on the basis of the embodiment thereof with reference to the drawings.

Figure 1:
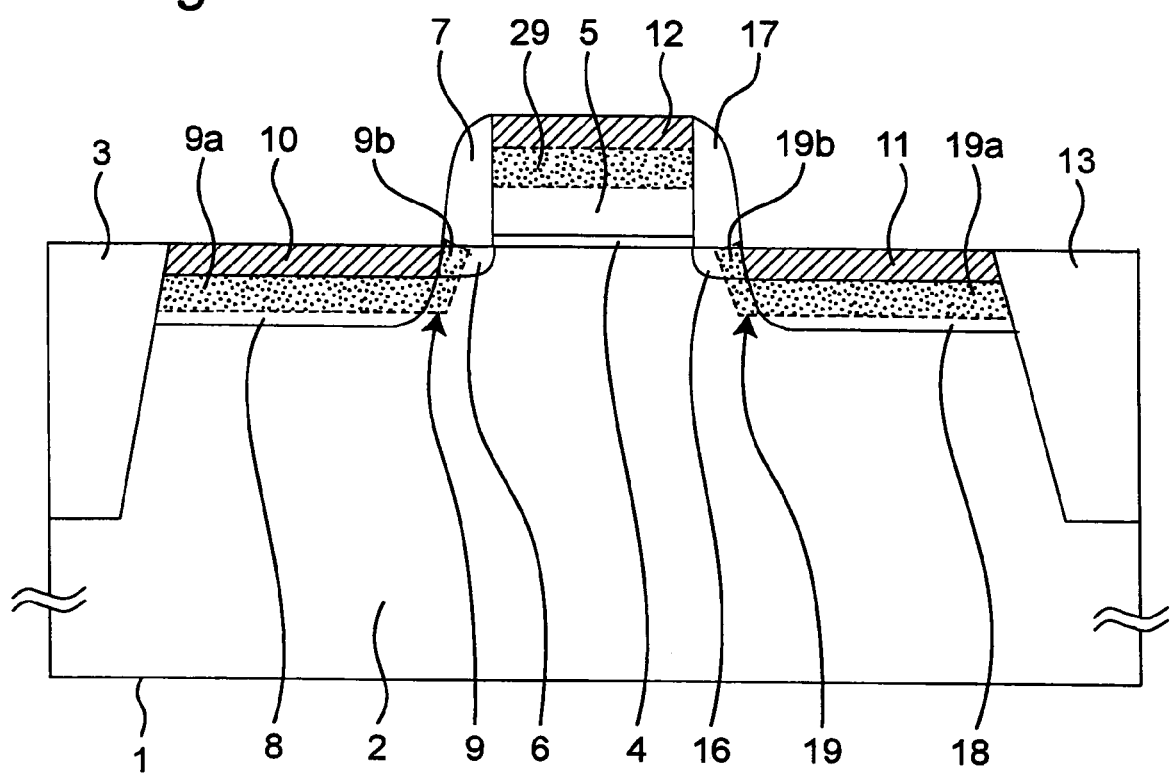
FIG. 1 is a schematic sectional view of a semiconductor device according to one embodiment of the present invention.

FIG. 1 shows a schematic sectional view of a semiconductor device according to one embodiment of the present invention.

The semiconductor device is a MOSFET provided with a silicon substrate 1 as one example of the substrate, an n-type well region 2 formed in this silicon substrate 1, first and second source/drain regions 8 and 18 constructed of a p-type diffusion layer formed on the n-type well region 2, a gate insulator 4 formed on a region located between the first source/drain region 8 and the second source/drain region 18, a polysilicon 5 formed as one example of the gate electrode on this gate insulator 4, sidewall spacers 7 and 17 formed on both right and left sides (in the figure) of this polysilicon 5, and LDD (lightly doped drain) regions 6 and 16 formed on the sides of the first and second source/drain regions 8 and 18 in vicinity to the polysilicon 5. The first and second source/drain regions 8 and 18 are arranged between an element isolation oxide 3 and an element isolation oxide 13. Moreover, the sidewall spacers 7 and 17 hold the polysilicon 5 therebetween in the direction parallel to the surface of the silicon substrate 1.

Oxygen-rich layers 9 and 19 for blocking the silicide reaction are formed in the uppermost portions of the silicon substrate 1 on the polysilicon 5 side. An oxygen-rich layer 29 for blocking the silicide reaction is also formed in an upper portion of the polysilicon 5. The oxygen-rich layers 9, 19 and 29 are each constructed of a highly doped layer of which the oxygen concentration is not lower than $1 \times 10^{-18}$ cm$^{-3}$.

The oxygen-rich layers 9 and 19 have first blocking portions 9a and 19a as one example of the first silicide reaction blocking region and second blocking portions 9b and 19b as one example of the second silicide reaction blocking region. The first blocking portions 9a and 19a are formed in the upper portions of the first and second source/drain regions 8 and 18 and block the silicide reaction that attempts to progress in the thickness direction of the silicon substrate 1. On the other hand, the second blocking portions 9b and 19b are formed at the end portions of the LDD regions 6 and 16, which end portions are located on the opposite side of the polysilicon 5, to block the silicide reaction that attempts to progress in the direction parallel to the surface of the silicon substrate 1.

The whole region of the oxygen-rich layer 29 serves as the first silicide reaction blocking region to block the silicide reaction that attempts to progress in the thickness direction of the silicon substrate 1.

To reduce the resistances of the source/drain and the gate, silicide layers 10, 11 and 12 are formed on the oxygen-rich layers 9, 19 and 29. Interfaces between the silicide layers 10, 11 and the LDD regions 6, 16 overlap the surfaces of the second blocking portions 9b, 19b of the oxygen-rich layers 9, 19, respectively, which surfaces are located on the sides of the silicide layers 10, 11.

According to the semiconductor device of the above-stated construction, the oxygen-rich layers 9, 19 and 29 contain oxygen ions, and therefore, the progress of the silicide reaction can be stopped. More in detail, the silicide reaction which for forming the silicide layers 10 and 11 stops on the surfaces of the first blocking portions 9a and 19a on the side of the polysilicon 5. As a result, the concentration of the silicide reaction high-melting-point metal atoms becomes equal to or lower than $1 \times 10^{16}$ cm$^{-3}$ at the interface (pn junction plane) between the first and second source/drain regions 8 and 18 and the n-type well region 2. This value of $1 \times 10^{16}$ cm$^{-3}$ is below the limit of detection by SIMS (Secondary Ion Mass Spectroscopy), which substantially indicates no existence of silicide reaction high-melting-point metal atom. Therefore, the first and second source/drain regions 8 and 18 can have a low resistance by virtue of the silicide layers 10 and 11, and the junction leakage current can be restrained.

Moreover, the silicide reaction for forming the silicide layer 12 stops on the surface of the oxygen-rich layer 29 located on the side opposite to the silicon substrate 1. Therefore, the concentration of the high-melting-point metal atoms at the interface between the polysilicon 5 and the gate insulator 4 is also not higher than $1 \times 10^{16}$ cm$^{-3}$. Therefore, the polysilicon 5 is allowed to have a low resistance by virtue of the silicide layer 12, and the reliability of the gate insulator 4 is not impaired.

Moreover, the silicide reaction for forming the silicide layers 10 and 11 stops on the surfaces of the second blocking portions 9b and 19b on the sides of the first and second source/drain regions 8 and 18. Therefore, the reaction does not progress into the LDD regions 6 and 16. Therefore, the leakage characteristic between the gate and the source/drain can be prevented from deteriorating.

FIGS. 2A through 2F are schematic sectional views showing a manufacturing process in the manufacturing method of the above-stated semiconductor device in the order of the manufacturing. Next, the manufacturing method of the semiconductor device is described below with reference to FIGS. 2A through 2F.

Figure 2A:
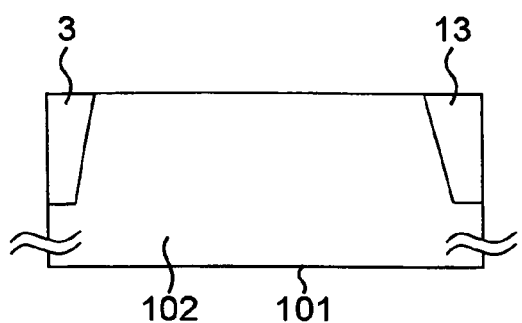
FIG. 2A is a schematic sectional view showing a stage of a manufacturing process in the manufacturing method of the above semiconductor device.

Firstly, as shown in FIG. 2A, element isolation oxides 3 and 13 are formed for isolating an active region on one principal surface of a silicon substrate 101, and thereafter, an n-type well 102 for forming the n-type well 2 is formed by ion implantation.

Figure 2D:
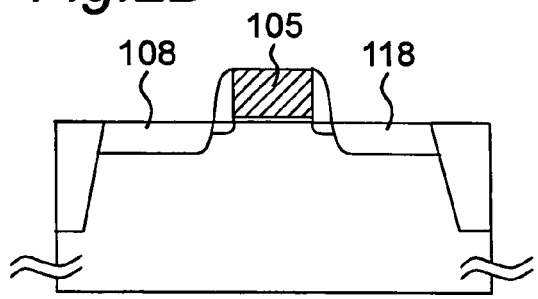
FIG. 2D is a schematic sectional view showing a subsequent stage of the manufacturing process in the manufacturing method of the above semiconductor device.
Figure 2B:
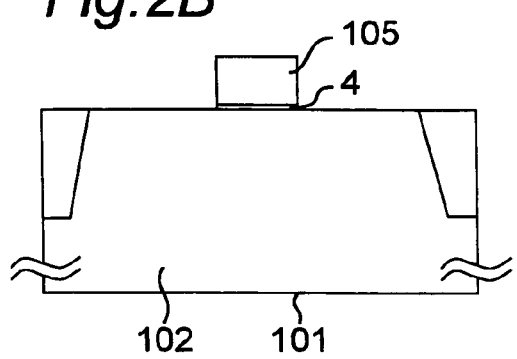
FIG. 2B is a schematic sectional view showing a subsequent stage of the manufacturing process in the manufacturing method of the above semiconductor device.

Next, as shown in FIG. 2B, a gate oxide 4 of, for example, 3 nm is formed by oxidizing the surface of the silicon substrate 101. Further, the polysilicon 5 is formed to a film thickness of, for example, 180 nm on the gate insulator 4 by the chemical vapor deposition (CVD) method. Subsequently, patterning is carried out by the well-known lithography technique and dry etching technique, to form the gate electrode made of polysilicon 105.

Figure 2E:
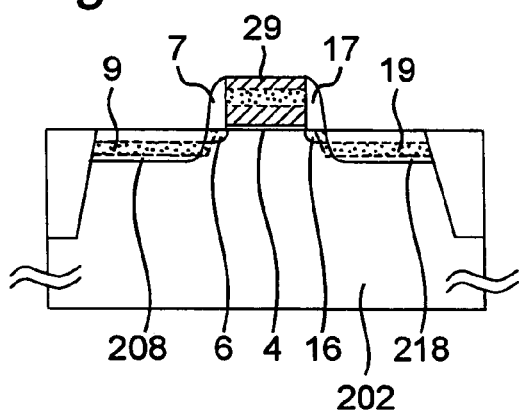
FIG. 2E is a schematic sectional view showing a subsequent stage of the manufacturing process in the manufacturing method of the above semiconductor device.
Figure 2C:
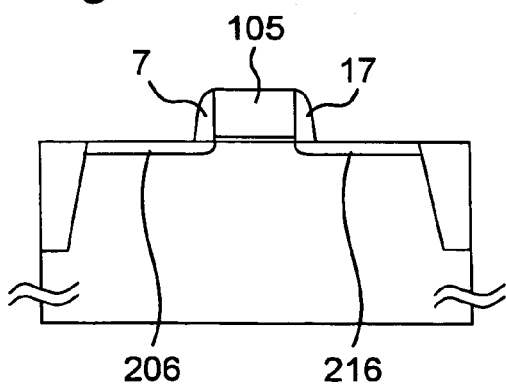
FIG. 2C is a schematic sectional view showing a subsequent stage of the manufacturing process in the manufacturing method of the above semiconductor device.

Next, as shown in FIG. 2C, by implanting ions of $BF_2$ on the conditions of, for example, 10 keV and $1.2 \times 10^{14}$ cm$^{-2}$, p$^-$-diffusion layers 206 and 216 for forming the LDD regions 6 and 16 are formed on both right and left sides in the figure below the polysilicon 5. Subsequently, sidewall spacers 7 and 17, which are made of silicon nitride, are formed on both right and left sides in the figure of the polysilicon 5.

Next, as shown in FIG. 2D, by implanting ions of $BF_2$ on the conditions of, for example, 30 keV and $2 \times 10^{15}$ cm$^{-2}$, p$^+$-diffusion layers 108 and 118 for forming the first and second source/drain regions 8 and 18 are formed on both right and left sides in the figure below the polysilicon 105. Then, by carrying out heat treatment at a temperature of, for example, 1020° C. for 10 seconds, the impurity ions implanted in the substrate and the gate electrode are activated.

Next, as shown in FIG. 2E, oxygen is introduced into the gate electrode and the substrate by using the well-known ion implantation technique to form a region for blocking the silicide reaction. In this case, if the implantation of oxygen ions is carried out on the conditions of, for example, an acceleration voltage of 50 keV and a dosage of $1 \times 10^{14}$ cm$^{-2}$, then the oxygen-rich layers 9, 19 and 29 of an oxygen concentration of not lower than $1 \times 10^{18}$ cm$^{-3}$ are formed at a depth of about 120 nm in the silicon and the gate electrode. It is desirable to timely adjust the acceleration energy of the oxygen implantation so that an oxygen concentration peak position is located below the source/drain junction depth and below the height of the gate electrode. In other words, it is preferable to adjust the acceleration energy of the oxygen implantation so that the oxygen concentration peak position is located shallower than the interfaces between the p+-diffusion layers 208, 218 and the n-type well 202 and shallower than the interface between the polysilicon 105 and the gate insulator 4.

Next, naturally-formed oxide films on the substrate surface and the gate polysilicon surface are removed by carrying out interfacial processing with a diluted HF solution. Thereafter, for example, a Co film of 10 nm and a TiN film of 200 nm are deposited by the sputtering method. In this case, the TiN film plays the role of a cap film for preventing the surface of the Co film from being oxidized in the subsequent silicide reaction stage.

Figure 2F:
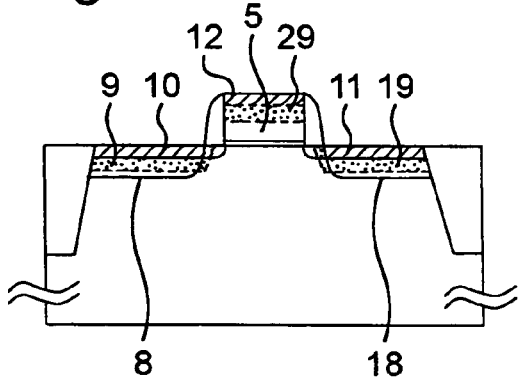
FIG. 2F is a schematic sectional view showing a subsequent stage of the manufacturing process in the manufacturing method of the above semiconductor device.
Figure 3:
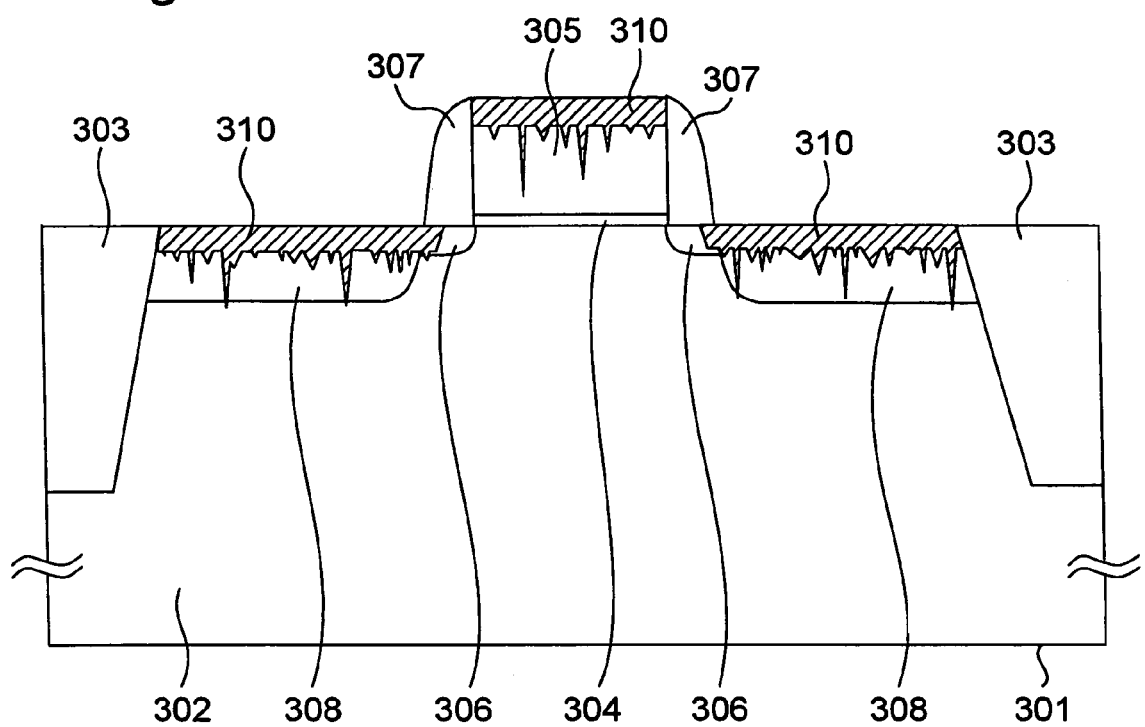
FIG. 3 is a schematic sectional view of a conventional semiconductor device.

Next, the reaction of the silicon with the Co film is promoted by carrying out heat treatment in, for example, a nitrogen atmosphere at a temperature of 525° C. for 60 seconds as a silicide reaction process. In the above stage, the silicide reaction is blocked by the oxygen-rich layers 9, 19 and 29, and therefore does not progress further to portions below the layers. Thus, no unevenness occurs at the interfaces between the silicide layers 9, 19, 29 and the silicon layer. As a result, silicide layers 10, 11 and 12 as shown in FIG. 2F are formed on the oxygen-rich layers 9, 19 and 29, respectively.

Finally, the TiN film and an unreacted cobalt film are selectively removed by a mixed solution of a hydrogen peroxide aqueous solution and sulfuric acid, and thereafter, heat treatment is subsequently carried out at a temperature of, for example, 700° C. for 40 seconds for the reduction in the resistance of the silicide layers.

A semiconductor device is subsequently completed by forming a wiring layer by a conventional technique. Although the case where the oxygen ions are implanted in the above-stated embodiment of the present invention, nitrogen ion implantation and carbon ion implantation are also possible because of existence of the silicide reaction blocking effect. The concentration thereof may be equivalent to that of oxygen.

Also, the source/drain are formed by implanting $BF_2$ ions in the process stage shown in FIG. 2D, and then, the oxygen-rich layers are formed by carrying out the oxygen implantation as shown in FIG. 2E. However, this order may be reversed. In other words, it is acceptable to carry out the process stage shown in FIG. 2E and thereafter carry out the process stage shown in FIG. 2D.

Moreover, although the Co film has been employed as a high-melting-point metal for the formation of the silicide layers, the present invention is not limited to this and also applicable to a case where a silicide film is formed by employing, for example, a Ti film or an Ni film.

The semiconductor device manufacturing method of the present invention is used for the formation of the p-MOSFET having the LDD structure in the above-stated embodiment. However, the method of the present invention may also be used for the formation of an n-MOSFET having an LDD structure. That is, the present invention produces utterly similar effects not only in the p-MOSFET but also in the n-MOSFET.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor device comprising:
   a substrate;
   a first conductive type well region formed in the substrate;
   first and second source/drain regions constructed of a second conductive type diffusion layer formed on the well region;
   a gate insulator formed in a region located between the first source/drain region and the second source/drain region;
   a gate electrode formed on the gate insulator;
   first silicide reaction blocking regions formed in upper portions of the gate electrode and the first and second source/drain regions to block a silicide reaction in a thickness direction of the substrate;
   a sidewall spacer on each side of the gate electrode as viewed cross sectionally;
   wherein the first silicide reaction blocking regions are at least partially formed laterally outwardly of the sidewall spacer on each side of the gate electrode; and
   wherein a concentration of silicide reaction high-melting-point metal atoms is not higher than $1 \times 10^{16}$ cm$^{-3}$ (i) at an interface between the gate insulator and the gate electrode, and/or (ii) at an interface between at least one of first and second source/drain regions and the well region.

2. The semiconductor device as claimed in claim 1, further comprising:
   lightly doped drain regions formed on sides of the first and second source/drain regions in vicinity to the gate electrode, the lightly doped drain regions having an impurity concentration lower than those in the first and second source/drain regions; and
   second silicide reaction blocking regions formed in the lightly doped drain regions at end portions opposite from the gate electrode to block the silicide reaction in a direction parallel to a surface of the substrate.

3. The semiconductor device as claimed in claim 2, wherein at least one of the first and second silicide reaction blocking regions is constructed of a highly doped layer in which a concentration of oxygen or nitrogen or carbon is not lower than $1 \times 10^{18}$ cm$^{-3}$.

4. A semiconductor device comprising:
   a substrate;
   a first conductive type well region formed in the substrate;
   first and second source/drain regions comprising a second conductive type diffusion layer formed on the well region;
   a gate insulator formed in a region located between the first source/drain region and the second source/drain region;
   a gate electrode formed on the gate insulator;
   first silicide reaction blocking regions formed in upper portions of the gate electrode and the first and second source/drain regions to block a silicide reaction in a thickness direction of the substrate; and
   wherein a concentration of silicide reaction high-melting-point metal atoms at an interface between the gate insulator and the gate electrode and at interfaces between the well region and the first and second source/drain regions is not higher than $1 \times 10^{16}$ cm$^{-3}$.

* * * * *